United States Patent
Breil et al.

(10) Patent No.: US 11,362,275 B2
(45) Date of Patent: Jun. 14, 2022

(54) ANNEALING PROCESSES FOR MEMORY DEVICES

(71) Applicant: Applied Materials, Inc., Santa Clara, CA (US)

(72) Inventors: Nicolas Louis Gabriel Breil, Alviso, CA (US); Siddarth Krishnan, San Jose, CA (US); Shashank Sharma, Fremont, CA (US); Ria Someshwar, Mountain View, CA (US); Kai Ng, San Jose, CA (US); Deepak Kamalanathan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 245 days.

(21) Appl. No.: 16/855,122

(22) Filed: Apr. 22, 2020

(65) Prior Publication Data

US 2020/0357993 A1    Nov. 12, 2020

Related U.S. Application Data

(60) Provisional application No. 62/844,501, filed on May 7, 2019.

(51) Int. Cl.
*H01L 45/00* (2006.01)
*H01L 27/24* (2006.01)

(52) U.S. Cl.
CPC ...... *H01L 45/1641* (2013.01); *H01L 27/2463* (2013.01); *H01L 45/1233* (2013.01);
(Continued)

(58) Field of Classification Search
CPC ............. H01L 45/1641; H01L 45/1233; H01L 45/1253; H01L 45/146
See application file for complete search history.

(56) References Cited

U.S. PATENT DOCUMENTS 8,754,392 B2 * 6/2014 Caimi ................. H01L 45/1625
257/E47.002
10,566,188 B2 * 2/2020 Clemons ............. H01L 45/1641
(Continued)

FOREIGN PATENT DOCUMENTS

KR    2007-0003529 A    1/2007
TW    I279889 B    4/2007
(Continued)

OTHER PUBLICATIONS

International Search Report and Written Opinion dated Aug. 14, 2020 in International Patent Application No. PCT/US2020/030685, 11 pages.
(Continued)

*Primary Examiner* — Mark V Prenty
(74) *Attorney, Agent, or Firm* — Kilpatrick Townsend & Stockton LLP (57) ABSTRACT

Exemplary methods of forming a memory structure may include forming a layer of a transition-metal-and-oxygen-containing material overlying a substrate. The substrate may include a first electrode material. The methods may include annealing the transition-metal-and-oxygen-containing material at a temperature greater than or about 500° C. The annealing may occur for a time period less than or about one second. The methods may also include, subsequent the annealing, forming a layer of a second electrode material over the transition-metal-and-oxygen-containing material.

20 Claims, 3 Drawing Sheets

(52) U.S. Cl.
CPC ........ *H01L 45/1253* (2013.01); *H01L 45/146* (2013.01); *H01L 45/1608* (2013.01)

(56) References Cited

U.S. PATENT DOCUMENTS

| | | |
|---|---|---|
| 2009/0227067 A1 | 9/2009 | Kumar et al. |
| 2009/0268500 A1 | 10/2009 | Fang et al. |
| 2009/0317958 A1 | 12/2009 | Tang et al. |
| 2015/0179935 A1 | 6/2015 | Hong et al. |
| 2015/0311067 A1* | 10/2015 | Sharma ............. H01L 21/02354 438/783 |

FOREIGN PATENT DOCUMENTS

| | | |
|---|---|---|
| TW | I562417 B | 12/2016 |
| TW | I628818 B | 7/2018 |

OTHER PUBLICATIONS

Kyoung-Moon Yu, et al., "Low-Temperature Fabrication of High Quality Gate Insulator in Metal-Oxide-Semiconductor Capacitor Using Laser Annealing", IEEE Electron Device Letters, vol. 40, No. 2, Feb. 2019, 4 pages.

International Preliminary Report on Patentability dated Nov. 18, 2021 in International Patent Application No. PCT/US2020/030685, 8 pages.

\* cited by examiner

ANNEALING PROCESSES FOR MEMORY DEVICES

CROSS REFERENCES TO RELATED APPLICATIONS

This application claims the benefit of priority to U.S. Provisional Patent Application No. 62/844,501 filed May 7, 2019, the contents of which are hereby incorporated by reference in their entirety for all purposes.

TECHNICAL FIELD

The present technology relates to semiconductor processes and equipment. More specifically, the present technology relates to treating metal-oxide materials.

BACKGROUND

Integrated circuits are made possible by processes which produce intricately patterned material layers on substrate surfaces. Producing patterned material on a substrate requires controlled methods for deposition and removal of materials. However, with new device designs, producing high quality layers of material includes new challenges.

Thus, there is a need for improved systems and methods that can be used to produce high quality devices and structures. These and other needs are addressed by the present technology.

SUMMARY

Exemplary methods of forming a memory structure may include forming a layer of a transition-metal-and-oxygen-containing material overlying a substrate. The substrate may include a first electrode material. The methods may include annealing the transition-metal-and-oxygen-containing material at a temperature greater than or about 500° C. The annealing may occur for a time period less than or about one second. The methods may also include, subsequent the annealing, forming a layer of a second electrode material over the transition-metal-and-oxygen-containing material.

In some embodiments, the substrate may be or include at least one of platinum, titanium, iridium, a dielectric, or tantalum. The methods may include forming individual memory cells subsequent forming a layer of the second electrode material. The annealing may be performed at a temperature between about 700° C. and about 900° C. The second electrode material may be or include at least one of platinum, titanium nitride, or tantalum nitride. The transition-metal-and-oxygen-containing material may be or include nickel, tantalum, or hafnium. The transition-metal-and-oxygen-containing material may be characterized by a carbon content greater than 0 atomic % and up to about 20 atomic %. The annealing may causes resistance of the transition-metal-and-oxygen-containing material to reduce from an as-deposited resistance. The annealing may be or include a laser anneal.

Some embodiments of the present technology may encompass methods of forming a memory structure. The methods may include forming a layer of a metal-and-oxygen-containing material overlying a substrate. The substrate may include a first electrode material, and the substrate may include a transistor underlying the first electrode material. The methods may include annealing the metal-and-oxygen-containing material at a temperature greater than or about 500° C. The annealing may occur for a time period less than or about one second, and the substrate may be characterized by a thermal budget below or about 500° C. The methods may include, subsequent the annealing, forming a layer of a second electrode material over the metal-and-oxygen-containing material.

In some embodiments, the substrate may be or include at least one of platinum, titanium, iridium, a dielectric, or tantalum. The methods may include forming individual memory cells subsequent forming a layer of the second electrode material. The annealing may be performed at a temperature greater than or about 750° C. The metal-and-oxygen-containing material may be characterized by a carbon content greater than 0 atomic % and up to about 20 atomic %. The substrate may be maintained under vacuum while being transferred from a first chamber in which the forming the layer of a metal-and-oxygen-containing material is performed to a second chamber in which the annealing is performed. The annealing may be performed for a time period at any single location of less than or about one tenth of a second. The annealing may be or include a laser anneal. The second electrode material may be different from the first electrode material. The annealing may reduce a resistance of the metal-and-oxygen-containing material by at least an order of magnitude.

Some embodiments of the present technology may encompass methods of forming a memory structure. The methods may include forming a layer of a metal-and-oxygen-containing material overlying a substrate. The substrate may include a first electrode material, and the substrate may include a transistor underlying the first electrode material. The methods may include annealing the metal-and-oxygen-containing material at a temperature greater than or about 700° C. The annealing may occur for a time period less than or about one second, and the substrate may be characterized by a thermal budget below or about 500° C. The methods may include, subsequent the annealing, forming a layer of a second electrode material over the metal-and-oxygen-containing material. The methods may include forming individual memory cells subsequent forming a layer of the second electrode material.

Such technology may provide numerous benefits over conventional systems and techniques. For example, the processes may produce materials that may require little or less forming after device formation. Additionally, the processes may afford increased efficiency and consistency by producing a prepared material to be used in a number of cells, instead of individually performing forming processes subsequent patterning. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As devices produced in semiconductor processing continue to shrink, uniformity, material quality, process control, and repeatability are becoming more challenging from process to process. To continue to improve device performance at reduced scale, alternative films and processes are being investigated for additional performance improvements relative to conventional devices.

For example, conventional memory structures include particular limitations. Dynamic random-access memory is a structure that, although characterized by relatively beneficial speed, is volatile. Accordingly, the memory tends to lose data when system power is off. Flash memory does not suffer from this loss, and maintains data throughout power cycling, however, the process of reading and writing is performed in multiple cycles, which may be a slower process. Accordingly, improved memory structures are being developed with a variety of newer material layers. For example, conductive bridging RAM, oxide RAM, magnetic RAM, correlated electron RAM, resistive RAM, and other memory structures are being developed. Many of these structures include new material layers utilizing transition metals or metalloids, which may boost operational characteristics of produced cells.

In general, a dielectric material in metal-insulator-metal or resistive memory structures is switched between a high resistance state and a lower resistance state by application of a voltage across the metal electrodes. By applying a voltage, such as a set voltage, a conductive path may be formed through the dielectric material that can be homogenous or localized. This path may be due to a phase change, formation of a filament, electroformation, or metal-insulator transition, which may allow the materials to operate as one or both of a memory or switch. By breaking the conduction path, such as with a reset, the material may revert to the higher resistance state.

Conventional processes using transition-metal oxides often produce individual cells prior to forming. However, this process may be inefficient as every cell will require forming individually. When oxide or other dielectric materials are deposited, the resistance is often well above a resistance level for operating as a switching layer. To lower the resistance to a point where switching may be performed, an electrical forming process is performed. Typically, the forming process involves applying high voltage to the oxide layer to induce damage to the layer, causing a type of soft dielectric breakdown, which lowers the resistance. Once this has been performed, a reset operation may be performed to break the filament or conductive path produced, which may then be reformed and broken during regular operation. As noted, however this forming process is typically performed on each cell individually, which is an inefficient process.

The present technology overcomes these issues by performing an annealing process that may produce a similar outcome to a forming process of a layer of metal-oxide material that may then be used in individual cells. The anneal may be performed at very high temperatures which may produce similar defects within the layer, while protecting underlying structures. Once the entire film has been treated, further device fabrication may occur and individual cells may be produced that may be partially if not fully formed to operate as switching layers in the produced cells.

Although the remaining disclosure will routinely identify specific structures, such as memory, for which the present structures and methods may be employed, it will be readily understood that the systems and methods are equally applicable to any number of structures and devices that may benefit from the incorporation of annealed or altered films. Accordingly, the technology should not be considered to be so limited as for use with any particular structures alone. Moreover, although an exemplary tool system will be described to provide foundation for the present technology, it is to be understood that the present technology can be produced in any number of semiconductor processing chambers and tools that may perform some or all of the operations to be described.

Figure 1:
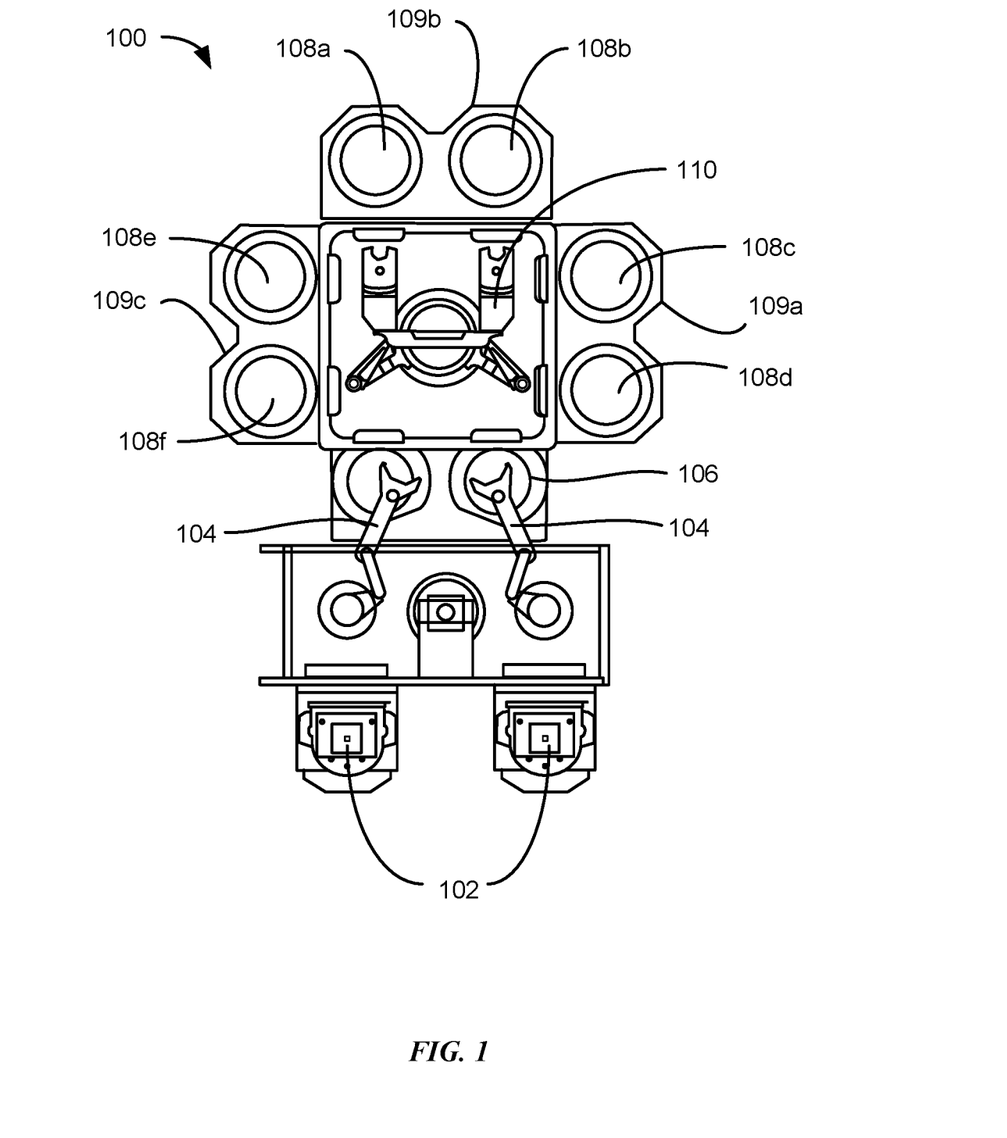
FIG. 1 shows a top plan view of one embodiment of an exemplary processing system according to some embodiments of the present technology.

FIG. 1 shows a top plan view of one embodiment of a processing system 100 of deposition, etching, baking, and curing chambers according to some embodiments of the present technology. In the figure, a pair of front-opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. Although a tandem system is illustrated, it is to be understood that platforms incorporating standalone chambers are equally encompassed by the present technology. A second robotic arm 110 may be used to transport the substrate wafers from the holding area 106 to the substrate processing chambers 108a-f and back. Each substrate processing chamber 108a-f, can be outfitted to perform a number of substrate processing operations including any number of deposition processes including cyclical layer deposition (CLD), atomic layer deposition (ALD), chemical vapor deposition (CVD), physical vapor deposition (PVD), as well as etch, pre-clean, anneal, plasma processing, degas, orientation, and other substrate processes.

The substrate processing chambers 108a-f may include one or more system components for depositing, annealing, curing and/or etching a material film on the substrate or wafer. In one configuration, two pairs of the processing chambers, e.g., 108c-d and 108e-f, may be used to deposit material on the substrate, and the third pair of processing chambers, e.g., 108a-b, may be used to cure, anneal, or treat the deposited films. In another configuration, all three pairs of chambers, e.g., 108a-f, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations, such as the anneal. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

Figure 2:
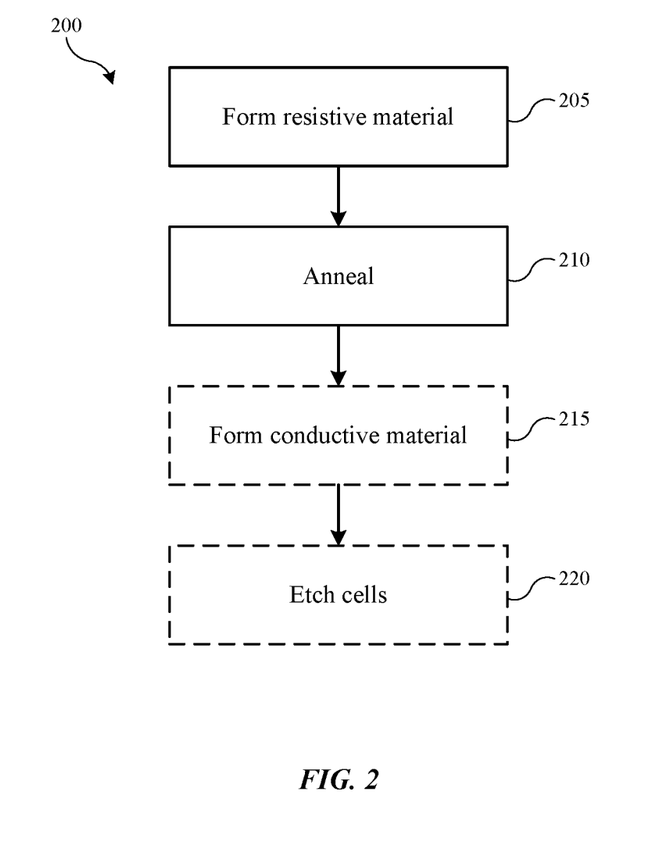
FIG. 2 shows exemplary operations in a method of formation and treating according to some embodiments of the present technology.

System 100, or more specifically chambers incorporated into system 100 or other processing systems, may be used to produce structures according to some embodiments of the present technology. FIG. 2 shows exemplary operations in a method 200 of forming and treating a semiconductor device according to some embodiments of the present technology. Method 200 may be performed in one or more processing chambers, such as chambers incorporated in system 100, for example. Method 200 may or may not include one or more operations prior to the initiation of the method, including front-end processing, deposition, etching, polishing, cleaning, or any other operations that may be performed prior to the described operations. The method may include a number of optional operations as denoted in the figure, which may or may not be specifically associated with some embodiments of methods according to the present technology. Method 200 describes operations shown schematically in FIGS. 3A-3D, the illustrations of which will be described in conjunction with the operations of method 200. It is to be understood that FIG. 3 illustrates only partial schematic views with limited details, and in some embodiments a substrate may contain any number of transistor or semiconductor sections having aspects as illustrated in the figures, as well as alternative structural aspects that may still benefit from any of the aspects of the present technology.

Figure 3A:
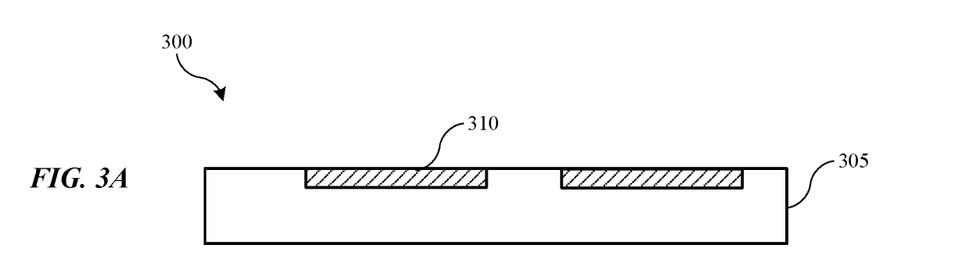
FIGS. 3A-3D show cross-sectional views of substrates being processed according to some embodiments of the present technology.

Method 200 may involve optional operations to develop the semiconductor structure to a particular fabrication operation. Although in some embodiments method 200 may be performed on a base structure, in some embodiments the method may be performed subsequent transistor or other material formation, which may create a thermal budget as will be further discussed below. As illustrated in FIG. 3A, the semiconductor structure may represent a device 300 after front-end or other processing has been completed. For example, substrate 305 may be a planar material, or may be a structured device, which may include multiple materials configured as posts, trenches, or other structures as would be understood are similarly encompassed by the present technology. Substrate 305 may include any number of conductive and/or dielectric materials including metals, which may include transition metals, post-transition metals, metalloids, oxides, nitrides, and carbides of any of these materials, as well as any other materials that may be incorporated within a structure. Additionally, substrate 305 may include an amount of metallization, such as conductive metals used as interconnects within a semiconductor device. For example, copper, tungsten, cobalt, or other metals may be formed in vias or other interconnects throughout the substrate.

One or more material layers may be formed over some or all of substrate 305, as well as formed at least partially within the substrate, to produce a structure that may be a planarized conductive material within a dielectric material in embodiments. For example, in some embodiments a conductive material 310 may optionally be formed overlying substrate 305, or recessed within a portion of substrate material 305. As one non-limiting example, at the exposed surface of substrate 305 may be a dielectric material, such as silicon oxide or any other dielectric, in which the conductive material may be formed. The conductive material 310 may be a continuous layer across the substrate, or may be intermittently formed across the surface of the substrate as illustrated. In one non-limiting example, the conductive material may be or include a metal that may be formed intermittently across the substrate 305. The metal may include tantalum, praseodymium, hafnium, titanium, iridium, rhodium, platinum, or any other material that may operate as an electrode in a memory structure or may be present in alternative structures, for example, and may include a combination of materials as well as oxides or nitrides of any of these materials in some embodiments.

The conductive material 310 may be etched, planarized, or otherwise processed to produce an intermittent pattern in some embodiments, which either through etching or other formation may expose a portion of substrate 305 between segments of conductive material 310. Although illustrated as two instances, it is to be understood that any number of sections of conductive material 310 may be included. Additionally, although schematically illustrated as including straight sidewalls, the formation or removal process of conductive material 310 may produce angled sidewalls. Thus, in some embodiments, the segments of conductive material 310 may be characterized by a frustum shape, or by an angled surface along one or more faces of the segments. Substrate 305, which may include conductive material 310, may be housed or positioned in a processing region of a semiconductor processing chamber, and method 200 may be performed to form an oxide material on the substrate.

Figure 3B:
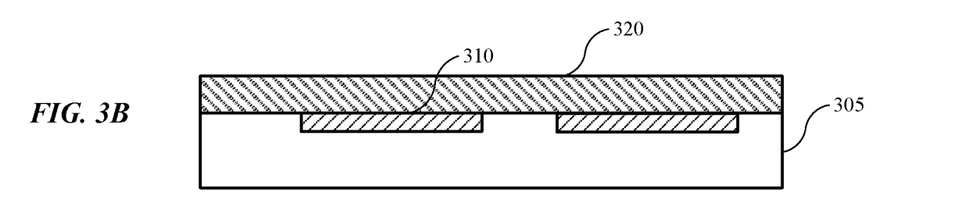

Method 200 may include forming a layer of an oxide material overlying the substrate and conductive material 310 in operation 205. The oxide material may be a transition-metal-and-oxygen-containing material or dielectric in some embodiments, which can operate as a switching layer after a forming operation, for example, between electrodes of a memory device. The oxide material may be formed across the conductive material 310, as illustrated in FIG. 3B with oxide material 320, and may extend fully across the material to overlie both regions of conductive material 310 as well as substrate material 305. The oxide material may be or include one or more metals or metal oxide materials including transition metals, metalloids, or poor metals. Exemplary materials from this list, which are not to be considered limiting, include titanium oxide, nickel oxide, hafnium oxide, silicon oxide, zirconium oxide, aluminum oxide, magnesium oxide, tantalum oxide, dysprosium oxide, scantium oxide, or lanthanum oxide, which may include any oxidation states or compounds of the materials.

The oxide film may be formed by any number of deposition techniques including chemical vapor deposition, physical vapor deposition, or atomic layer deposition. An amount of carbon may be incorporated within the film using a variety of precursors to produce an oxycarbide film in some embodiments, which may adjust or tune electrical properties within the oxide film. The present technology may include an atomic percentage of carbon within the first layer that may be consistent through the depth of the layer, or may be incorporated along a gradient with higher concentration close to the material surface, and reduced incorporation through the film depth. The carbon percentage may be the same or different throughout the layer, and may include a carbon content between about 0 atomic % and about 50 atomic %. In some embodiments, the layer may include a carbon content between or about 0 atomic % and about 40 atomic %, between or about 0 atomic % and about 30 atomic %, between or about 0 atomic % and about 20 atomic %, between or about 0 atomic % and about 10 atomic %, greater than or about 0 atomic %, greater than or about 0.1 atomic %, greater than or about 0.2 atomic %, greater than or about 0.3 atomic %, greater than or about 0.5 atomic %, greater than or about 0.8 atomic %, greater than or about 1 atomic %, greater than or about 3 atomic %, greater than or about 5 atomic %, greater than or about 8 atomic %, greater than or about 10 atomic %, or any other amount or range encompassed by any of these ranges.

Process conditions may also be configured to affect the formation. In some embodiments, some aspects of the methods may be performed under vacuum, and in some embodiments vacuum conditions may not be broken as a substrate is transferred between chambers to perform operations of the methods. Pressure within the system may be maintained at less than or about 100 Torr for any of the formation operations being performed, and in some embodiments may be maintained at less than or about 80 Torr, less than or about 60 Torr, less than or about 50 Torr, less than or about 40 Torr, less than or about 30 Torr, less than or about 20 Torr, less than or about 10 Torr, less than or about 5 Torr, less than or about 1 Torr, less than or about 0.1 Torr, less than or about 0.01 Torr, or less, although formation rates may increase as pressure is maintained or increased between about 0.5 Torr and about 50 Torr in some embodiments.

Temperature may also impact formation of the oxide layers, and in some embodiments a temperature of any of the operations, either individually or collectively, may be performed at temperatures above or about 100° C., although in some embodiments deposition may occur at lower temperatures. One or more operations may also be performed at temperatures above or about 150° C., and may be performed at temperatures above or about 200° C., above or about 250° C., above or about 300° C., above or about 350° C., above or about 400° C., above or about 450° C., above or about 500° C., or higher. The operational temperatures may be adjusted based on precursors used, for example, as well as on device thermal budgets. For example, in some embodiments an oxide film, including a transition-metal-and-oxygen-containing film may be produced as a mid or back-end-of-line operation, for which temperature may be maintained below or about 500° C., below or about 400° C., or lower, to protect underlying transistor structures as previously discussed. Additionally, some precursors may begin to thermally decompose above certain temperatures, and thus operational temperatures may be adjusted to reduce precursor decomposition in some embodiments.

The oxide material may be formed to any thickness to produce a target overall structural thickness. For example, the combined thickness for all incorporated layers may be greater than or about 1 nm, greater than or about 10 nm, greater than or about 50 nm, greater than or about 100 nm, greater than or about 500 nm, or more, as well as any smaller range encompassed by any of these stated ranges. Any constituent layer may occupy any amount of the overall thickness of the layer. In some embodiments the oxide material may be formed to a lesser amount than may be used in some conventional technologies. Accordingly, in some embodiments the oxide layer may be less than or about 100 nm, and may be less than or about 50 nm, less than or about 40 nm, less than or about 30 nm, less than or about 20 nm, less than or about 10 nm, less than or about 9 nm, less than or about 8 nm, less than or about 7 nm, less than or about 6 nm, less than or about 5 nm, less than or about 4 nm, less than or about 3 nm, less than or about 2 nm, less than or about 1 nm, or less.

Figure 3C:
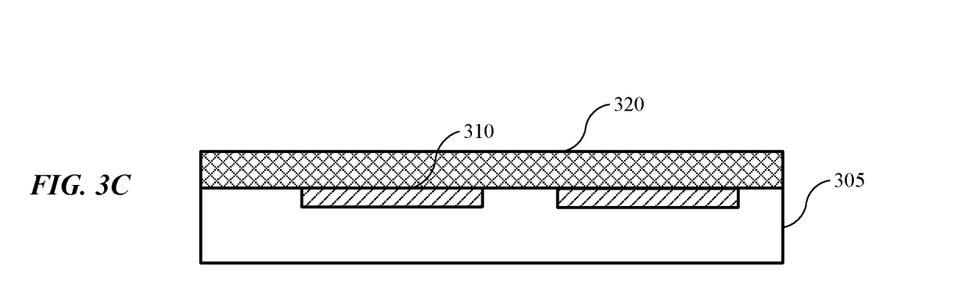

After the oxide material has been formed, an anneal operation may be performed to create structural bond breakage or deformation through the structure as previously described. Although one or more additional anneals may be performed to densify or stabilize the film after deposition, which may increase resistance, the present technology may also perform a high temperature, low timing anneal in a process configured to produce film structures similar to forming operations as previously described, and reduce the internal resistance of the material layer. At operation 210, a high temperature anneal may be performed, which may be performed to limit an impact on underlying features, while creating defects in layer 320 of the oxide material, as illustrated in FIG. 3C.

As previously described, underlying transistor structures may have been produced in front-end processing, and other materials may have been formed through the substrate, including copper or other conductive interconnect materials. Consequently, a thermal budget of less than 500° C., or less than or about 400° C., may exist for the semiconductor stack. However, thermal budget often relates to an amount of thermal energy transferred to a full substrate during any specific operation, and although proportional to temperature, a thermal budget may also be characterized by a temperature process applied to a substrate for a particular amount of time. The present technology may perform processes that occur for less than or about 1 second in some embodiments, which may protect copper interconnects and other structures. Although some rapid thermal processes occurring for a few seconds or less can be performed for some semiconductor processing, the present structures may be relatively near copper interconnects, for example, during back-end processing. Consequently, anneals even lasting two or three seconds may impact the interconnects causing movement in the conductive metal, which may potentially damage the structures. Additionally, by performing an anneal configured to lower film resistance of oxide material 320, later forming processes may be limited or avoided, and much more efficient processing of an entire film may be performed by the present technology.

Temperatures of the anneal may be directly responsible for producing the defects similar to a forming operation, and in some embodiments the anneal may be performed at temperatures greater than or about 500° C., although even higher temperatures may more consistently produce bond breakage and defects, which may lower the resistance of the material sufficiently to operate as a switching material. Hence, in some embodiments, the anneal may be performed at a temperature greater than or about 600° C., greater than or about 650° C., greater than or about 700° C., greater than or about 750° C., greater than or about 800° C., greater than or about 850° C., greater than or about 900° C., greater than or about 950° C., greater than or about 1,000° C., greater than or about 1,050° C., greater than or about 1,100° C., or higher, although higher temperature anneals may impact structures beneath the layer of metal oxide material 320. Accordingly, in some embodiments the temperature may also be adjusted based on a thickness of the oxide material deposited.

The time during which the anneal is performed may impact the formation of defects as well as a penetration depth of the anneal, which may damage underlying structures, such as by breaking structural bonds and creating defects through the film to adjust resistivity. As noted above, anneals of even a few seconds were shown to damage underlying materials, as well as to cause copper movement in some embodiments. Hence, in some embodiments of the present technology, anneals may be performed for a time at any discrete location of less than or about 1 second, and in some embodiments may be performed for less than or about 900 milliseconds, less than or about 800 milliseconds, less than or about 700 milliseconds, less than or about 600 milliseconds, less than or about 500 milliseconds, less than or about 400 milliseconds, less than or about 300 milliseconds, less than or about 200 milliseconds, less than or about 100 milliseconds, less than or about 80 milliseconds, less than or about 50 milliseconds, less than or about 20 milliseconds, less than or about 10 milliseconds, less than or about 5 milliseconds, less than or about 1 millisecond, or less. By applying high temperatures for short periods of time, defects may be created through the deposited oxide material to reduce the resistance to a low resistance state from an as-deposited state, while having minimal or no effect on underlying structure or materials. The anneal may reduce a resistance by at least one order of magnitude in some embodiments, and may reduce the resistance by at least about two orders of magnitude, at least about three orders of magnitude, or more.

In order to produce high temperature anneals for short periods of time, a number of specialized anneals may be performed including laser anneal processes, spike anneal processes, rapid thermal anneal processes, flash lamp anneals, and/or furnace anneal processes, as long as the anneal may be performed for a sufficiently short period of time, which many anneals including some rapid thermal processing and furnace anneals may not be capable of adequately performing due to ramp up and/or ramp down periods. Accordingly, in some embodiments a laser-based anneal may be used. Laser anneal processes may deliver a constant energy flux from an energy source to a small region on the surface of the substrate, which may be translated during the anneal, or discrete locations may be annealed with spot treatments. The energy source may deliver electromagnetic radiation energy to perform the annealing process at desired regions of the substrate. Typical sources of electromagnetic radiation energy may include, but are not limited to, an optical radiation source, an electron beam source, an ion beam source, or a microwave energy source, any of which may be monochronistic or polychronistic and may have any desired coherency. In some embodiments, the energy source may be an optical radiation source using one or more laser sources. The lasers may be any type of laser such as gas laser, excimer laser, solid-state laser, fiber laser, or semiconductor laser, as non-limiting examples, and which may be configurable to emit light at a single wavelength or at two or more wavelengths simultaneously.

The anneal process may include applying a laser beam sequentially to at least some portions of the material being annealed, such as the oxide material 320. In operation, the laser beam may anneal a first portion of the oxide material 320 for a desired time, the substrate and/or laser beam may be moved, and the laser beam may anneal a second portion of the oxide material 320 for a desired time. The laser beam may be operated in a pulsed or continuous mode and over a desired range of wavelengths and intensities. In some embodiments, the laser beam may have a wavelength between about 200 nm and about 20 micrometers, such as between about 700 nm and 1200 nm, for example, and an energy density of about 0.1 $W/cm^2$ to about 10 $W/cm^2$. Conditions may be adjusted depending on the absorbing properties of the material being annealed, for example, and the speed of the substrate being translated, or scanned, relative to the laser beam delivered to the desired region of the substrate. The dwell time of the laser beam can be varied, by either varying the speed of the laser motion or by repeating the exposures. In either case, laser scan rates may range from about 25 mm/sec to about 350 mm/sec to achieve these millisecond dwell times.

Figure 3D:
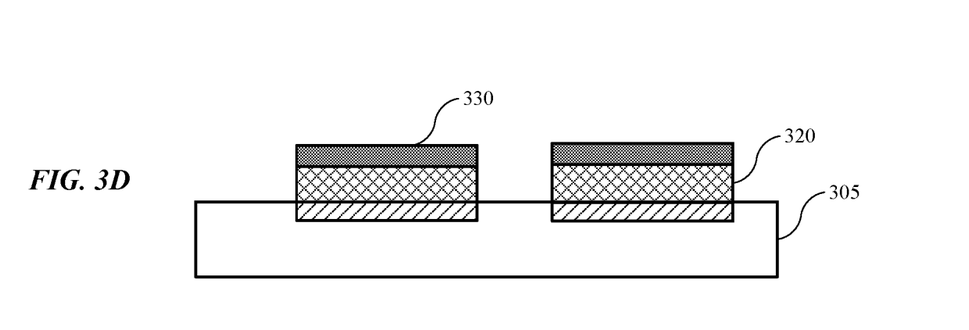

The present technology may also produce combination structures that may include additional materials, as well as additional layers, subsequent performing the anneal. FIG. 3D may also illustrate a cross-sectional view of substrates being processed according to additional embodiments of the present technology in which additional structural layers may be included. FIG. 3D illustrates additional embodiments in which a subsequent conductive material 330 may be formed overlying the oxide layer 320. The subsequent layer of conductive material 330 may be incorporated on an opposite surface of the oxide material as the first conductive material 310. For example, in an optional operation 215, subsequent formation of the oxide material, which may be a transition-metal-oxide material, additional electrode material 330 may be formed over the annealed material 320. The formation of an additional electrode material may produce a memory device where the annealed oxide material may operate as a switching layer. The conductive material 330 may be any of the electrode materials previously noted, as well as any other conductive materials that may operate as an electrode of the formed structure. The conductive material 330 may be the same electrode material as conductive material 310, although in some embodiments the materials may be different from one another.

Either prior to or subsequent deposition of the second conductive material 330, individual cells may be patterned from the annealed oxide material 320. As illustrated, oxide material 320 may be etched by any number of etching methods in optional operation 220 to produce a number of cells, such as memory cells along a substrate. By performing the cell separation subsequent the annealing operation, a more efficient fabrication may occur. Additionally, the anneal process according to some embodiments of the present technology may improve uniformity of the material in cells as compared to some conventional technologies. For example, voltage forming operations may be performed at voltages over 2 V in voltage sweeping, for example, after cells have been produced. Where the defects are formed within the material may be difficult to control in these technologies. By utilizing anneals according to some embodiments of the present technology, however, damage may be applied more uniformly, or at more specific and desired locations with laser annealing. For example, based on scanning and dwell of the laser, a more controlled defect formation may be performed, which may locate the defects in a more desired and consistent location through the cell material, and may more uniformly reduce resistance cell-to-cell.

In some embodiments an additional anneal may be performed further down a fabrication sequence, such as in an integration operation. This anneal may be performed on the produced structures or any other material, and the anneal may be performed at temperatures exceeding 300° C. However, these anneals may differ from the anneals discussed above, which are discrete anneals performed specifically to damage a deposited oxide material, while limiting, minimizing, or preventing damage to underlying structures, whereas integration anneals may thermally conduct throughout an entire substrate. Anneals according to the present technology may have limited penetration, and may be limited to a depth associated with an exposed film, such as the oxide material. Additionally, a forming operation may be performed subsequent device production, although in some embodiments the forming may be performed at lower voltages, such as below or about 2 V, below or about 1.5 V, below or about 1 V, or less, which may limit additional structural damage to the device. By performing millisecond or less anneals according to some embodiments of the present technology, forming operations may be performed at lower voltages or avoided, and more efficient and uniform cell fabrication can be produced by reducing the resistance of an entire oxide layer, which may then subsequently be processed to produce individual cells.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a material" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming a memory structure, the method comprising:
   forming a layer of a transition-metal-and-oxygen-containing material overlying a substrate, wherein the substrate comprises a first electrode material;
   annealing the transition-metal-and-oxygen-containing material at a temperature greater than or about 500° C., wherein the annealing occurs for a time period less than or about one second; and
   subsequent the annealing, forming a layer of a second electrode material over the transition-metal-and-oxygen-containing material.

2. The method of forming a memory structure of claim 1, wherein the substrate comprises at least one of platinum, titanium, iridium, a dielectric, or tantalum.

3. The method of forming a memory structure of claim 1, further comprising patterning individual memory cells subsequent forming a layer of the second electrode material.

4. The method of forming a memory structure of claim 1, wherein the annealing is performed at a temperature between about 700° C. and about 900° C.

5. The method of forming a memory structure of claim 1, wherein the second electrode material comprises at least one of platinum, titanium nitride, or tantalum nitride.

6. The method of forming a memory structure of claim 1, wherein the transition-metal-and-oxygen-containing material comprises nickel, tantalum, or hafnium.

7. The method of forming a memory structure of claim 6, wherein the transition-metal-and-oxygen-containing material is characterized by a carbon content greater than 0 atomic % and up to about 20 atomic %.

8. The method of forming a memory structure of claim 1, wherein the annealing causes a resistance of the transition-metal-and-oxygen-containing material to reduce from an as-deposited resistance.

9. The method of forming a memory structure of claim 1, wherein the annealing comprises a laser anneal.

10. A method of forming a memory structure, the method comprising:
    forming a layer of a metal-and-oxygen-containing material overlying a substrate, wherein the substrate comprises a first electrode material, and wherein the substrate further comprises a transistor underlying the first electrode material;
    annealing the metal-and-oxygen-containing material at a temperature greater than or about 500° C., wherein the annealing occurs for a time period less than or about one second, and wherein the substrate is characterized by a thermal budget below or about 500° C.; and
    subsequent the annealing, forming a layer of a second electrode material over the metal-and-oxygen-containing material.

11. The method of forming a memory structure of claim 10, wherein the substrate comprises at least one of platinum, titanium, iridium, a dielectric, or tantalum.

12. The method of forming a memory structure of claim 10, further comprising forming individual memory cells subsequent forming a layer of the second electrode material.

13. The method of forming a memory structure of claim 10, wherein the annealing is performed at a temperature greater than or about 750° C.

14. The method of forming a memory structure of claim 10, wherein the metal-and-oxygen-containing material is characterized by a carbon content greater than 0 atomic % and up to about 20 atomic %.

15. The method of forming a memory structure of claim 10, wherein the substrate is maintained under vacuum while being transferred from a first chamber in which the forming the layer of a metal-and-oxygen-containing material is performed to a second chamber in which the annealing is performed.

16. The method of forming a memory structure of claim 10, wherein the annealing is performed for a time period at any single location of less than or about one tenth of a second.

17. The method of forming a memory structure of claim 16, wherein the annealing comprises a laser anneal.

18. The method of forming a memory structure of claim 10, wherein the second electrode material is different from the first electrode material.

19. The method of forming a memory structure of claim 10, wherein the annealing reduces a resistance of the metal-and-oxygen-containing material by at least an order of magnitude.

20. A method of forming a memory structure, the method comprising:
- forming a layer of a metal-and-oxygen-containing material overlying a substrate, wherein the substrate comprises a first electrode material, and wherein the substrate further comprises a transistor underlying the first electrode material;
- annealing the metal-and-oxygen-containing material at a temperature greater than or about 700° C., wherein the annealing occurs for a time period less than or about one second, and wherein the substrate is characterized by a thermal budget below or about 500° C.;
- subsequent the annealing, forming a layer of a second electrode material over the metal-and-oxygen-containing material; and
- forming individual memory cells subsequent forming a layer of the second electrode material.

* * * * *